United States Patent [19]

Wells, Jr.

[11] Patent Number: 4,503,390

[45] Date of Patent: Mar. 5, 1985

[54] SWITCHLESS VOLTAGE, CONTINUITY AND POLARITY INDICATOR

[75] Inventor: Peter M. Wells, Jr., Sycamore, Ill.

[73] Assignee: Ideal Industries, Inc., Sycamore, Ill.

[21] Appl. No.: 524,225

[22] Filed: Aug. 19, 1983

Related U.S. Application Data

[63] Continuation of Ser. No. 261,525, May 7, 1981, abandoned.

[51] Int. Cl.³ .................... G01R 19/00; G01R 19/16
[52] U.S. Cl. .................................. 324/133; 324/149; 324/51
[58] Field of Search ................ 324/51, 52, 130, 145, 324/133, 149

[56] References Cited

U.S. PATENT DOCUMENTS

| 2,290,760 | 7/1942 | Mehaffie | 324/149 X |
| 3,416,074 | 12/1968 | Schoonover | 324/51 |
| 4,214,200 | 7/1980 | Hollander | 324/133 X |

FOREIGN PATENT DOCUMENTS

| 0590017 | 1/1960 | Canada | 324/51 |
| 0318368 | 9/1929 | United Kingdom | 324/133 |
| 1192563 | 5/1970 | United Kingdom | 324/51 |

Primary Examiner—Stanley T. Krawczewicz
Assistant Examiner—Jose M. Solis
Attorney, Agent, or Firm—Kinzer, Plyer, Dorn & McEachran

[57] ABSTRACT

This is concerned with a voltage tester of the so-called solenoid type and is more specifically concerned with such a voltage tester which is constructed and arranged to also test the continuity of its leads and prods or contacts.

3 Claims, 8 Drawing Figures

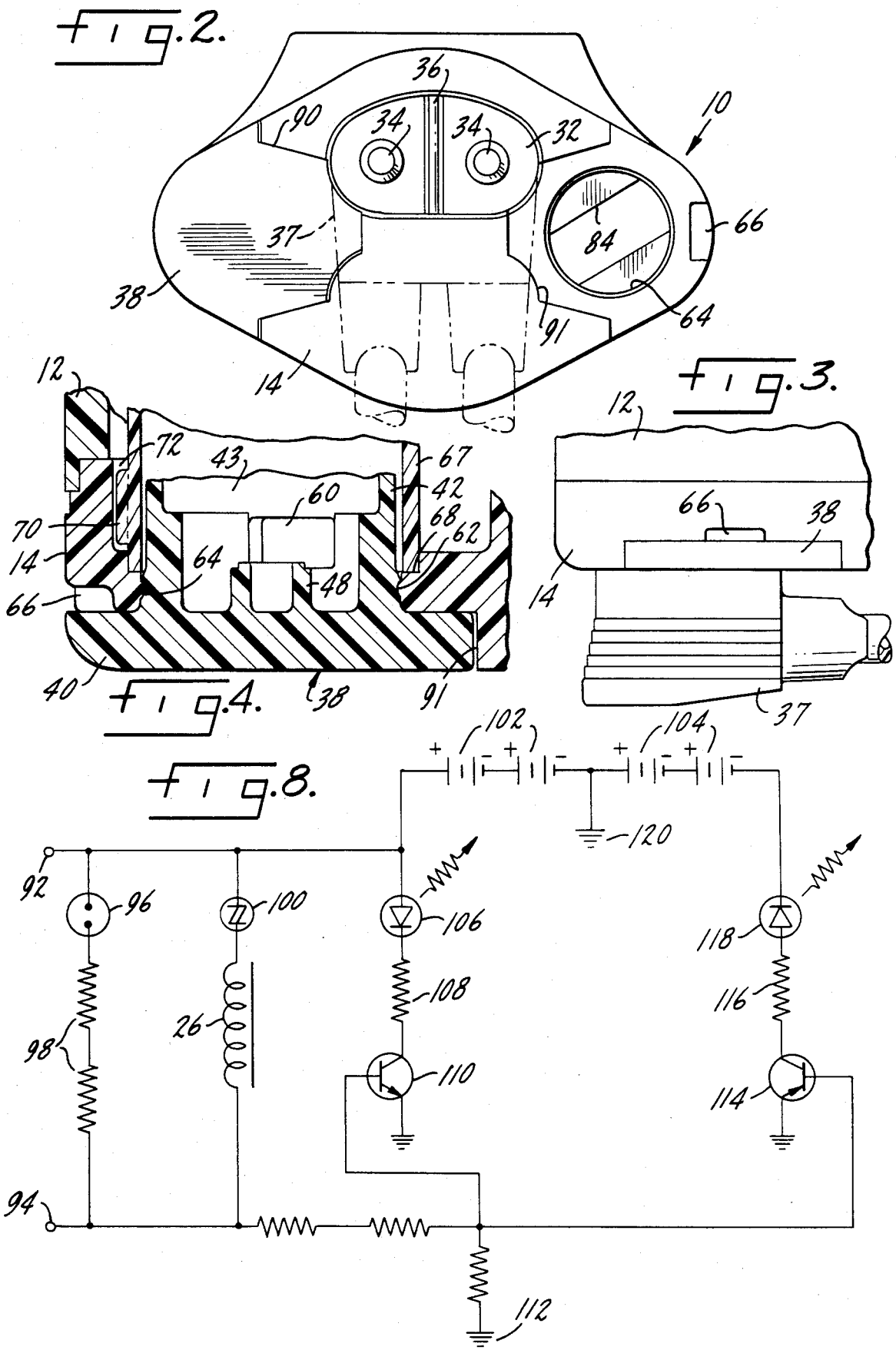

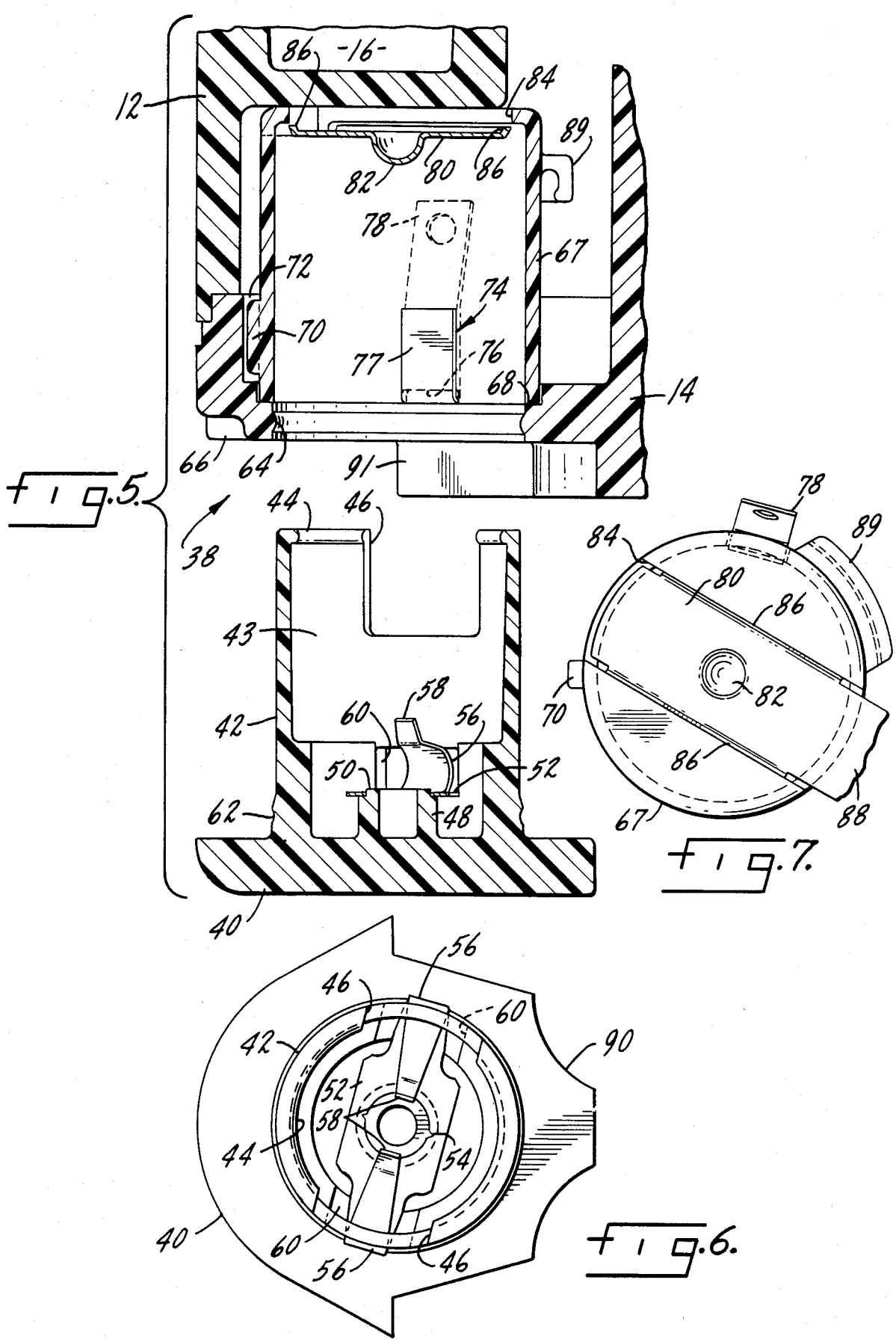

SWITCHLESS VOLTAGE, CONTINUITY AND POLARITY INDICATOR

This application is a continuation of application Ser. No. 261,525, filed May 7, 1981 now abandoned.

SUMMARY OF THE INVENTION

This invention is concerned with a voltage tester of the so-called solenoid type and is more specifically concerned with a voltage tester which also has the ability to check the continuity of its own leads and contacts.

A primary object of the invention is a continuity testing circuit for a voltage tester which enables the user to check to see whether or not its leads have been damaged or broken.

Another object is a solenoid voltage tester which can be checked for continuity by touching the prod tips together.

Another object is a checking circuit for a solenoid voltage tester which alerts the user to whether or not the tester is functioning properly or is defective.

Another object is a battery socketing arrangement for a voltage tester which simplifies servicing and installation of new batteries.

Another object is a voltage tester of the above type which insures that the operator or user will know whether or not the unit is functioning properly.

Another object is a unique battery socketing or mounting arrangement in a voltage tester housing.

Another object is a combination solenoid voltage tester and a continuity function, all in one tool.

Other objects will appear from time to time in the ensuing specification and drawings.

BRIEF DESCRIPTION OF THE DRAWINGS

FIG. 2 is a bottom view with parts removed for clarity and on an enlarged scale.

FIG. 3 is a partial side view showing the probe socket assembled.

FIG. 4 is a partial section on an enlarged scale showing the battery holder.

FIG. 5 is a partially exploded view of the lower left sectional part of FIG. 1.

FIG. 6 is a top view of the battery holder shown in FIG. 4.

FIG. 7 is a top view of a part of the battery socket shown in FIG. 4; and

FIG. 8 is a circuit for the unit.

DESCRIPTION OF THE PREFERRED EMBODIMENTS

Figure 1:
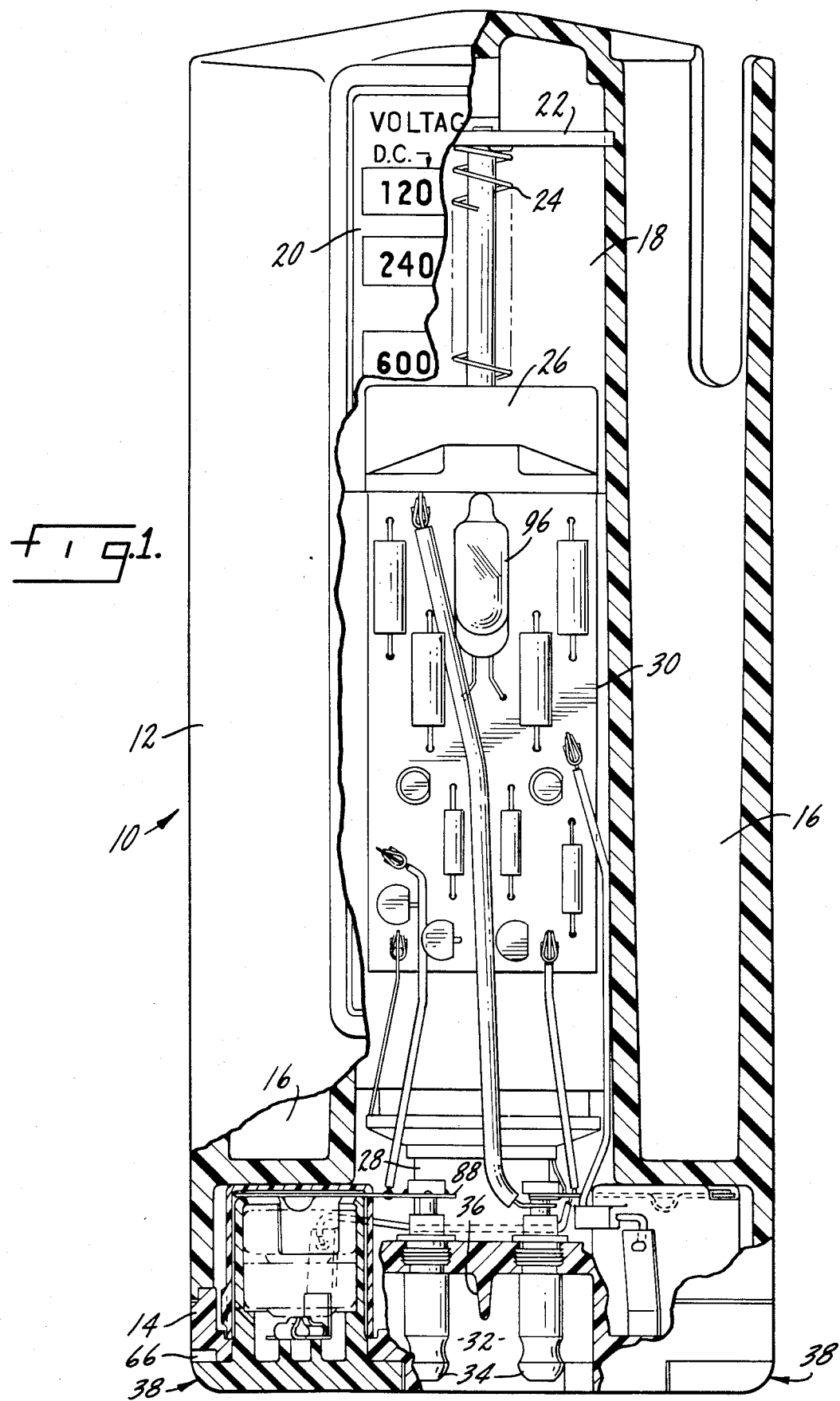
FIG. 1 is a front view, partially in section, of the voltage tester.

In FIG. 1 the housing of the voltage tester is indicated generally at 10 and includes a top or cover 12 mounted on or connected to a base 14. The housing or cover includes 3 compartments, two of which are shown at 16 which are open on top to accept prods, one such prod cavity 16 on each side, and a third 18 in the center which is closed and accepts or houses the operating mechanism. The face or front of the top or cover has a series of windows or openings or what may be considered a window arrangement 20 with graduations or indicia thereon with certain transparencies so that an indicator 22 on the inside may be viewed, depending upon its position, to indicate the particular voltage that is being detected. The indicator 22 is spring biased at 24 to an upper position and is pulled down to an indicating position by a solenoid or coil 26 which is mounted on a socket 28 projecting upwardly from the base 14. A circuit 30 in the form of a circuit board is also suitably positioned inside of the housing. The details of the circuit will be explained hereinafter.

The base includes a downwardly opening socket 32, FIGS. 1 and 2, which has two prongs or plugs 34 with a central dividing wall 36 to accept a plug 37 to which are connected the leads and contacts, not shown. As noted in FIG. 1 the socket 32 is countersunk in the base 14 and the contacts or prongs 34 are connected to the circuit, as explained later.

A pair of battery holders 38 are socketed into the base 14 and, as shown in FIG. 2, since they are mirror images of each other, only one will be described in detail. Each battery holder has a base 40 with a riser or cylinder 42 defining a battery chamber 43 that has an inwardly disposed rim 44 at the top and enlarged slots in the upper edge as at 46 to provide a certain flexibility of the upper portion thereof. The inside of the cylinder has a riser 48 generally in the center thereof which, through a pilot 50 positions a bent spring contact 52 which is mounted on the pilot in a certain position. The spring contact has arms extending outwardly on each side with reversed bends 56 thereafter projecting at 54 inwardly to upstanding contacts 58 disposed generally in the center of the cylinder 42. The bends 56 at the outer ends of the arms extend through openings 60 in the side wall of the cylinder and the proportioning is such that a snug fit is provided thereby holding the spring contact in place without other physical attachment, such as staking or the like.

The outer surface of cylinder 42 has a detent as at 62 which is shown as extending all the way around the cylinder to mate with and correspond to an inwardly extending ridge or bead 64 with the dimensioning being such that an interference fit is provided so that when the plug or insert is inserted up into the base 14, a snap action is provided thereby holding the battery holder removably in place in the base. A screw driver slot is provided at 66 so that the battery holder can be wedged loose.

The base has a corresponding container or can 67 which is open downwardly and rests on an abutment 68 in the base with a key 70 at a suitable location on the exterior thereof that fits into a corresponding slot 72 in the base for purposes of orientation. A generally U-shaped bent metal contact 74 is provided around the lower edge or skirt of container 66 fitted through a slot or gap 76 in the bottom thereof so that the lower edge will fit flush against abutment 68. The inner leg 77 rises for contact with the spring contact 52. An upstruck ear 78 on the outer leg may have a suitable opening therein for an electric connection.

An upper contact 80 is positioned inside of the top of the container 66 with a downwardly depending dimple 82 generally in the center thereof to contact the battery. The top of the can or container 66 has a cross slot 84 into which the upper contact 80 fits. The contact itself has edges or rims 86 on each side thereof which fit under the edges of the slot or opening 84 and can be flexed into place. The contact has a tail 88 extending from one side thereof which, as shown in FIG. 1, makes contact with one of the prongs or prods 34. The side of the can 66 has a wire guide 89 of a certain arcuate extent.

When two silver oxide or "pancake" type batteries are positioned in the cavity 43 in the battery holder they will contact the upstanding ears 58 on the bottom and the dimple 82 on the top. The spacing is such that an interference fit is provided thereby depressing the ears 58 somewhat with the reversely bent arms or elbows 56 constituting a spring. With the batteries properly loaded into the battery holder, it can be inserted up in the bottom of the base into the container 67 until the interference fit 62-64 causes it to snap into place, as shown in FIG. 3. The periphery of the base element 40 of the battery holder, as shown in FIG. 5, is contoured in a scalloped or uneven circumference, as at 90 which corresponds to a wall 91 in the base 14 so that the battery holder would only have one orientation. The particular orientation is such that one of the reverse bends 56 in the lower spring contact in the battery holder will be aligned with and slide against the inner leg 77 of the other contact thereby placing the batteries in the circuit.

The other battery holder is more or less the same but a reverse image. It will be noted in FIG. 2 that the left battery holder is in place while the right battery holder has been removed thereby exposing the socket for clarity of illustration. When the battery holders are fully inserted and seated, their bases 40 generally conform to and complete the bottom of the base 14. The plug 37 overlaps the bases 40 of both battery holders so that they can not either fall out or be removed while the plug 37 is inserted. The periphery of each of the battery holders, meaning the base thereof, is irregularly shaped or contoured, as shown in FIG. 2, as is the matching portion of the base 14, all of which is indicated generally at 90.

The circuit itself is shown in FIG. 8 in which the prods or contacts are indicated at 92 and 94 which are representative of the two plugs or prods 34 but have been given different numbers here for purposes of explaining the operation. A neon glow lamp 96 is connected across the contact with suitable protective resistors 98. The solenoid 26 which operates the visual indicator 22 is also placed across the line in series with a threshold voltage device 100 which in this case is a silicone bi-directional switch.

Pairs of batteries 102 and 104 indicate the batteries in the battery holders 38. These are connected in turn first to a light emitting diode 106 and through a resistor 108 to a transistor 110. The base of transistor 110 is connected to ground at 112. The base of a second transistor 114 is also connected to ground with its collector being connected through a resistance 116 to a second light emitting diode 118 and then to the other side of the batteries. It will note that the batteries are separated by a ground connection 120.

The use, operation and function of the invention are as follows.

Solenoid voltage testers have been in use for many years to indicate the presence or absence of electrical AC or DC power for ranges of 80-600 volts. These voltage testers were designed to be used in "rough use type" environments (industrial maintenance or new construction jobs) but small enough to be carried by the electrician while performing daily routines. They are preferred by many electricians over meters because of their durability (no sensitive meter movement), compactness and lower price. Many electricians or troubleshooters are only interested in knowing if power exists or it does not exist or if the voltage souce is 120, 240, 480 or 600. However, these solenoid voltage testers have a drawback; that is, although the tester body is very rugged and strong, the lead sets are vulnerable. Lead sets are run over by lift trucks or other moving equipment, caught in machines, snagged on corners or cut inadvertently by pliers. In many cases, this failure is hidden and unsuspected by the user, who may or may not be the same person using the tester each time. Thus the electrician can get a false indicatation of "no power" when power is, in fact, present but the lead set is discontinuous. This could result in a potential accident. Electricians are instructed to always test the device on a known live circuit before using it but a known live circuit is not always available.

The circuit of FIG. 8 should be considered and may be described in three phases. The first phase is when a positive variable voltage is applied to terminal 92. Initially starting with zero volts nothing happens. As this voltage is increased to a low voltage, say, approximately five volts, as measured between terminals 92 and 94, transistor 110 will be turned on because a negative voltage is applied to its base. Turning on transistor 110 results in the light emitting diode 106 being turned on. The user will observe this through one of the windows 20. Resistance 108 which may be, for example, 100 ohms, limits the current flow and thus protects or prevents damage to the light emitting diode 106 as well as extending its operational life.

It should be noted during this first phase, i.e. when a positive variable voltage is applied to terminal 92, that the second transistor 114 cannot be turned on as it requires a negative voltage on its base.

A further increase in the applied positive voltage to terminal 92 results in a magnitude that will overcome the breakdown or threshold voltage of the threshold device 100, meaning the silicone bi-directional switch. This results in a viable circuit from terminal 92 through threshold device 100 and the coil 26 back to terminal 94. This establishes a current flow path through the coil to impose an ampere turn condition to act on the visible plunger 22 as a voltage level indicator. Further increase in this applied positive voltage results in the firing of the neon indicator lamp 96 which may be said to operate at a given selected voltage, for example something on the order of 50 to 70 volts at the probe terminals. At this magnitude of applied voltage, two indicators of voltage prevail, the left light emitting diode 106 as well as the neon lamp 96. Further increases of applied voltage result in no change to the light emitting diode 106 or the neon lamp 96 condition. Rather, further increases will move the visible plunger 22 to whatever height corresponds to the indicated magnitude of applied voltage. This is to say that deeper penetration of the core into the coil will take place to indicate the larger applied voltage, observable through the windows 20.

In the second phase, a negative applied voltage is applied to terminal 92. The operational behavior of the circuit is the same except that transistor 114 will be turned on which will cause the right hand light emitting diode 118 to be turned on, observable through the windows 20. At the same time the left transistor 110 will not be turned on and its light emitting diode 106 will not glow because the right transistor 114 now sees a negative voltage on its base and consequently turns on.

The result is that depending upon which of the two light emitting diodes 106 or 118 are seen to glow, different polarities of the applied voltage can be observed and the device serves as a discreet visual means of indicating polarity.

In the third phase, an AC voltage is applied to the probe terminals 92 and 94 and a composite situation occurs in the circuit. Both of the above first and second phases occur at a rate equal to the applied frequency. So both light emitting diodes 106 and 118 glow and the user knows that the applied voltage is an AC current.

A big advantage of the circuit is that it is self testing. When the probes 92 and 94 are shorted, meaning put into contact with each other, the left light emitting diode 106 is on. This indicates a continuous circuit from the positive terminal of the internal batteries 102 through both probes 92 and 94, the left hand transistor 110, the protective resistance 108 and the light emitting diode 106 back to the negative terminal to the battery. This test may also serve as an indicator of a low internal battery; for example, the probes are shorted, the total circuiting has electrical continuity but the left light emitting diode 106 is not turned on. This indicates a low internal battery.

As an indication of the various ranges of voltages that may be detected which is of course dependent upon the magnitude of the various components, it is suggested that from zero up to about 4-5 volts nothing occur. Thereafter either the left or the right light emitting diode 106 and 118 will come on up to 50 to 70 volts. Thus polarity of the circuit will be indicated. From 50 to 70 volts and above, the particular light emitting diode will stay on and also the neon lamp 96 will fire. These then stay on up to approximately 120 volts at which point the plunger 22 reacts to indicate the level of applied voltage, it being understood that the light emitting diode 106 or 118 indicating polarity as well as the neon lamp 96 both stay on. Thereafter up to the limits of the tester which may be 600 volts or so, the light emitting diode and the neon lamp stay on and the visual indicator 22 assumes the proper position corresponding to the applied voltage.

The internal battery arrangement itself and the socketing into the base of the housing have the advantages that the batteries are securely and accurately held in the housing but at the same time can be easily replaced. In addition the slot 66 can accept the end of a screwdriver so that the interference fit 62-64 can be overcome and the battery holder and batteries popped out. The spring contact in the bottom of the battery holder as well as the dimple in the top insures that the batteries will be held firm between the top and bottom but may easily be removed due to the split upper section which allows the sides to be flexed apart.

One of the main advantage of the circuit is that in addition to testing polarity, continuity can be tested through the leads by touching the probes and observing whether or not the light emitting diode 106 comes on. Also, the batteries 102 and 104 operate the light emitting diodes 106 and 118 which avoids problems with the line voltage which varies too much.

An interesting additional benefit is the behavior of the tester on applied AC voltage due to the design of the plunger assembly. The total mechanical inertia of the plunger and spring assembly may be of such a magnitude that with the AC voltage applied, a hum or buzzing can be felt or heard. Thus the voltage indication can be visually seen, audibly heard and physically felt.

Whereas the preferred form and several variations of the invention have been shown and described as well as suggested in the specification, it should be understood that suitable additional modifications, changes, substitutions and alterations may be made without departing from the invention's fundamental theme.

The embodiments of the invention in which an exclusive property or privilege is claimed are defined as follows:

1. In a voltage tester of the solenoid type, a housing, a pair of leads extending from the housing with contact prods on the ends thereof, a solenoid and circuit therefor in the housing and connected to the leads for indicating the voltage of a voltage source when the prods are placed in contact therewith, polarity indicating means in the housing and connected to the leads, and a battery and battery operated continuity circuit in the housing connected to the solenoid circuit and to the polarity indicating means for using the polarity indicating means to signal continuity of lack thereof when the prods are put in contact with each other.

2. The voltage tester of claim 1 further characterized in that the solenoid circuit has a threshold device therein constructed to operate at a higher voltage than the battery circuit.

3. In a voltage tester, a testing circuit including a pair of test contacts adapted to be placed in contact with a source of unknown polarity, two semi-conductors each having a light emitting device in series therewith, battery means, the semi-conductors and their light emitting devices being connected to opposite terminals of said battery means, one light emitting device being connected to one of the test contacts and the semi-conductors being connected to the other, a voltage of one polarity at the test prods causing one light emitting device to operate and a voltage of opposite polarity causing the other light emitting device to operate, and a solenoid connected across said test contacts, a threshold conductive device in series with the solenoid adapted to become conductive at a voltage level above that of the battery means.

* * * * *